United States Patent
Chen et al.

(10) Patent No.: US 7,538,611 B2
(45) Date of Patent: May 26, 2009

(54) AUDIO AMPLIFIER WITH HIGH POWER AND HIGH EFFICIENCY

(75) Inventors: Wei Chen, Campbell, CA (US); Peng Xu, San Jose, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 100 days.

(21) Appl. No.: 11/369,929

(22) Filed: Mar. 7, 2006

(65) Prior Publication Data

US 2006/0197596 A1 Sep. 7, 2006

Related U.S. Application Data

(60) Provisional application No. 60/659,644, filed on Mar. 7, 2005.

(51) Int. Cl.
*H03F 3/217* (2006.01)
(52) U.S. Cl. .................................. 330/251; 330/207 A
(58) Field of Classification Search ................... 330/10, 330/251, 207 A
See application file for complete search history.

(56) References Cited

U.S. PATENT DOCUMENTS

| | | | |
|---|---|---|---|
| 4,949,048 A * | 8/1990 | Tokumo et al. | 330/10 |
| 6,420,930 B1 | 7/2002 | Takagishi | |
| 6,441,685 B1 * | 8/2002 | MacMillan | 330/10 |
| 6,476,673 B2 | 11/2002 | Takagishi | |
| 6,489,841 B2 | 12/2002 | Takagishi | |
| 6,992,527 B2 * | 1/2006 | Yokoyama | 330/10 |
| 7,046,727 B2 * | 5/2006 | Takagishi | 375/238 |
| 7,209,003 B2 * | 4/2007 | Chen et al. | 330/10 |
| 2007/0096812 A1 * | 5/2007 | Lee | 330/251 |

* cited by examiner

*Primary Examiner*—Robert Pascal
*Assistant Examiner*—Hieu P Nguyen
(74) *Attorney, Agent, or Firm*—Perkins Coie LLP

(57) ABSTRACT

A Class D audio amplifier with output signals capable of being as high as the amplifier's supply voltage. The audio amplifier contains a comparator, a positive output stage, and a negative output stage. The output signal from the positive output stage and the output signal from the negative output stage have opposite polarities and are connected to the comparator's negative and positive input terminals respectively. The Class D audio amplifier has superior transient response, and in turn, provides good sound quality and low THD. The resulting variable switching frequencies also help to alleviate EMI problems.

20 Claims, 2 Drawing Sheets

BTL Audio Amplifier with Single Comparator

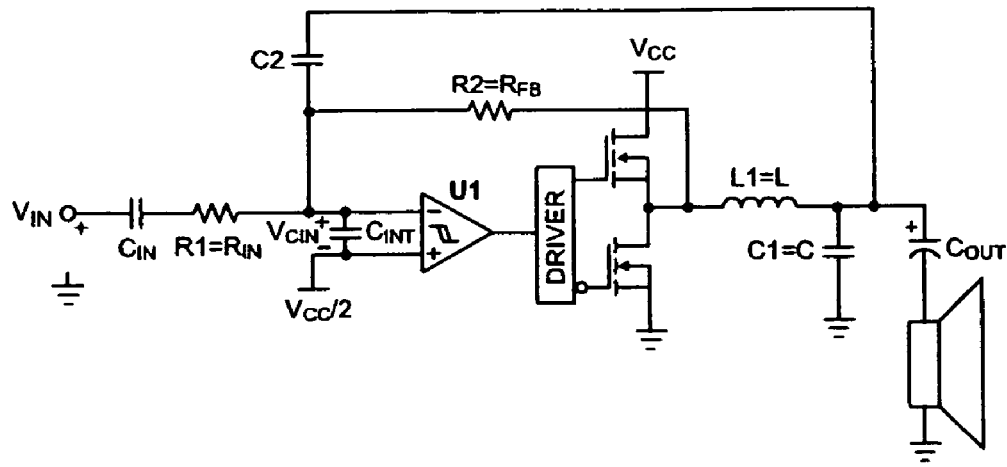
Figure 1 - Single Ended Class D Audio Amplifer (Prior Art)
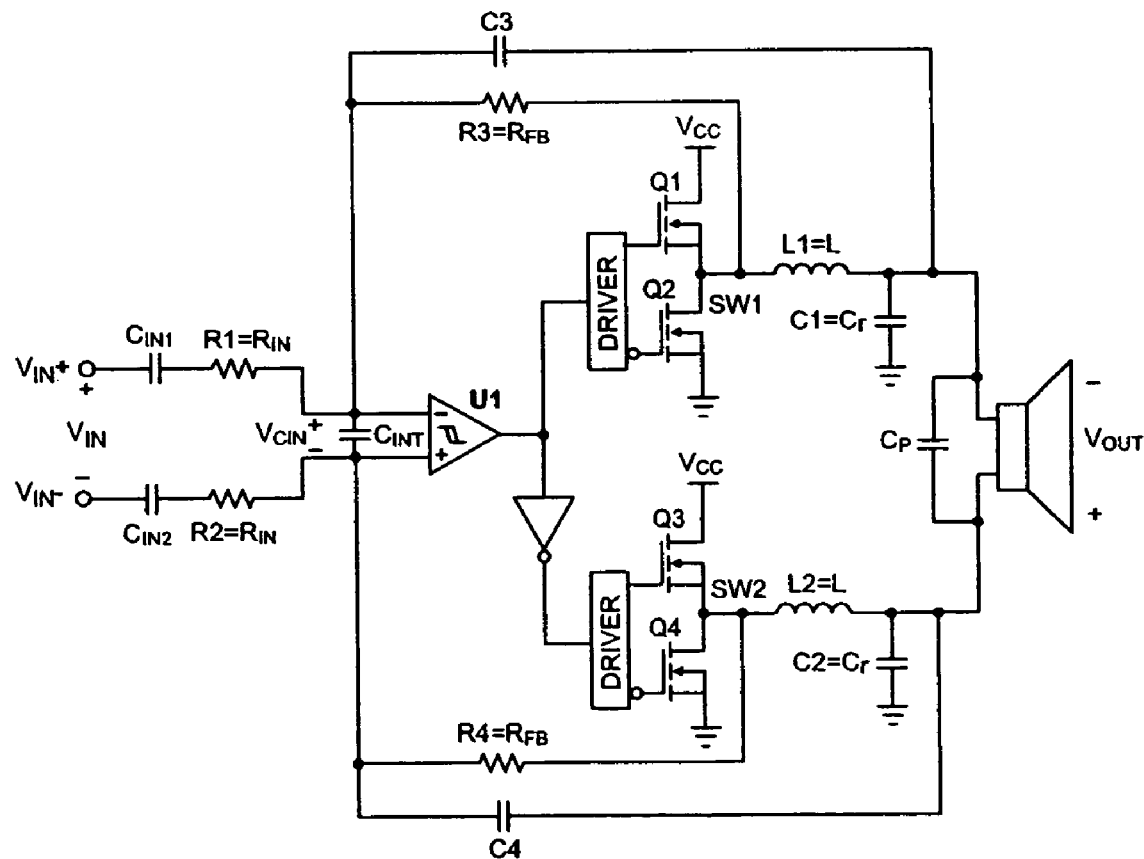
Figure 2 - BTL Audio Amplifier with Single Comparator

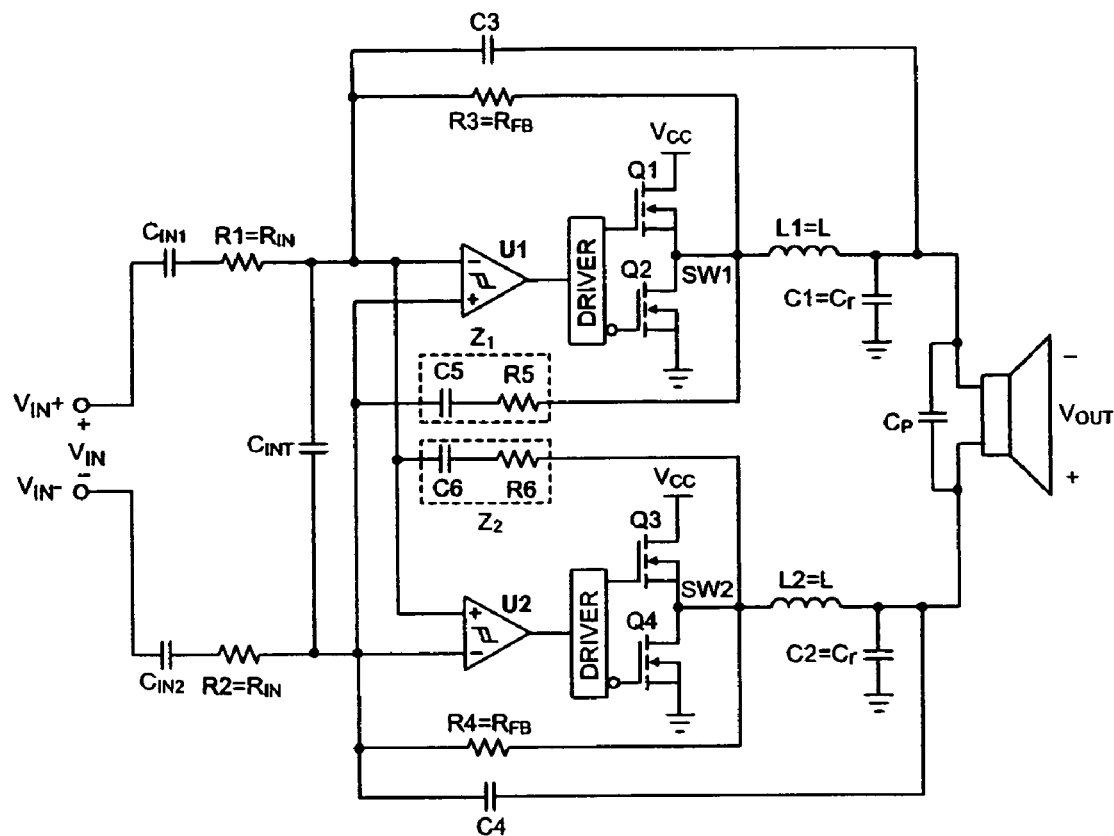
Figure 3 - BTL Audio Amplifier using Two Comparators under SchulzAUDIO AMPLIFIER WITH HIGH POWER AND HIGH EFFICIENCY

CROSS-REFERENCE TO RELATED APPLICATION

This application claims priority to U.S. provisional patent application Ser. No. 60/659,644, filed on Mar. 7, 2005, which is hereby incorporated herein by reference.

TECHNICAL FIELD

The present invention relates generally to audio signal processing, and in particular, relates to a system that includes a Class D amplifier for audio signal amplification and other audio signal processing.

BACKGROUND INFORMATION

Class-D audio amplifiers are often used for audio amplification because of their power efficiency. Typically, the Class D audio amplifier is operated in switch mode with minimized internal power consumption. The so-called "Bang-Bang" type control has improved the loop response and simplified the feedback loop control. This type of control is useful for a single-ended amplifier, which is shown in FIG. 1. The amplifier's output is connected to an LC filter, and then fed to a speaker through a large DC-blocking capacitor(s). In steady state operation, if the SW node is high, the voltage on the Cint and Vcin will increase gradually. After a certain time t1, the Vcin increases beyond the hysteresis of the comparator and causes the comparator to switch state and the SW node to switch from high to low. C2 provides an additional feedback from the speaker output and helps to improve the transient response. The method can help audio amplifiers achieve superior transient response and thus minimize the switching frequency and its related switching losses. In addition, the method varies the switching frequency and helps to suppress the amplitude of electric-magnetic interference (EMI) noises. However, the output signal amplitude from this method can only be up to half of the supply voltage and its output power is limited.

For higher power applications, it is desirable to have the amplifier's output signal reach full supply voltage.

BRIEF DESCRIPTION OF DRAWINGS

The following figures illustrate embodiments of the invention. These figures and embodiments provide examples of the invention and they are non-limiting and non-exhaustive.

FIG. 1 shows an example of a single-ended class D audio amplifier.

FIG. 2 illustrates an embodiment of the present invention.

FIG. 3 illustrates another embodiment of the present invention.

DETAILED DESCRIPTION

Embodiments of a system and method that uses an audio amplifier and accompanying circuitry to achieve highly efficient audio signal amplification and other audio signal processes are described in detail herein. In the following description, some specific details, such as example circuits and example values for these circuit components, are included to provide a thorough understanding of embodiments of the invention. One skilled in relevant art will recognize, however, that the invention can be practiced without one or more specific details, or with other methods, components, materials, etc.

The following embodiments and aspects are illustrated in conjunction with systems, circuits, and methods that are meant to be exemplary and illustrative. In various embodiments, the above problem has been reduced or eliminated, while other embodiments are directed to other improvements.

The present invention relates to circuits and methods of high efficient audio signal amplification. Proposed circuits in an audio amplifier can provide output signals with their amplitudes substantially as high as the supply voltage of the amplifier.

FIG. 2 illustrates an embodiment of the present invention in a "bridge-tied-load" (BTL) audio amplifier with a single comparator. The amplifier's output signal amplitude can be substantially as high as the amplifier's supply voltage. The positive input audio signal and the switching node SW1 of the negative output stage are connected to the negative input of the comparator U1. The negative input audio signal and the switching node SW2 of the positive output stage are connected to the positive input of the comparator. The configuration allows the negative output stage (Q1, Q2) and the positive output stage (Q3, Q4) to have opposite output polarities. In steady state operation, assume that the output of U1 is "high", SW1 node is "high", and SW2 node is "low". The voltage on a capacitor Cint, Vcin, increases gradually. After a time t1, Vcin increases beyond the hysteresis of U1 and forces U1 to switch its state. The output of U1 then changes to "low". The SW1 node becomes "low" and the SW2 node becomes "high". Vcin then decreases gradually. After a time t2, Vcin decreases below the hysteresis of U1 and forces U1 to switch its state again. These switching actions repeat periodically if the input signal is a dc voltage. The input capacitors $C_{IN1}$ and $C_{IN2}$, with an equivalent capacitance, provide the dc decoupling of the input signals. Inductors L1 and L2, and capacitors, C1, C2 and Cp, are the $2^{nd}$ order filters for a speaker. Capacitors, C3 and C4, with an equivalent capacitance, provide direct feedbacks from the speaker's output voltage and improve the transient responses of the amplifier. Typically, C3 and C4 are much smaller than the integration cap Cint. The RMS output voltage on the speaker, Vout, and the RMS input audio signal, Vin, follow the below equation.

$$\frac{V_{OUT}}{V_{IN}} = \frac{R_{FB}}{R_{IN}}$$

To produce flat frequency response within the audio frequency range, the quality factor Q is preferably lower than 1. Q is defined as:

$$Q = \frac{\sqrt{L_{eq}/C_{eq}}}{R_{OUT}}$$

$$L_{eq} = 2L$$

$$C_{eq} = \frac{C_r}{2} + C_p$$

FIG. 3 illustrates another embodiment of the present invention in a BTL audio amplifier with two comparators. In the circuit, it is recommended that $C_{IN1}=C_{IN2}$, C3=C4 and Z1=Z2. The method utilizes two independent single ended amplifiers. The operation principle is similar to the BTL audio amplifier in FIG. 2. However, because two comparators have two independent hystereses, the large mismatch of hysteresis can cause one channel to stop switching. The problem can be resolved by adding two positive feedback loops, Z1 and Z2. Again, assume that SW1 is high and SW2 is low in their initial states. If the hysteresis of comparator U1 is lower than that of the comparator U2, the comparator U1 changes the state first and both SW1 and SW2 are low. Without Z1 and Z2 feedbacks, the comparator U2 will not change state and thus the switching action will stop unless the swing of input signal causes U2 to change its state again. With the addition of Z1 and Z2 feedback loops, when SW1 changes from high to low, Z1 forces the Vcin to instantly increase further. With properly designed Z1, the additional voltage increase helps Vcin to surpass the hysteresis of U2 and thus force SW2 to switch from low to high. Typically, Z1 and Z2 can be either capacitors or capacitor and resistor in series.

In the present invention, methods and circuits are introduced to achieve highly efficient Class D audio amplifiers with their output signals capable of being as high as the amplifiers' supply voltage. In one embodiment of the present invention, the audio amplifier contains a comparator, a positive output stage, and a negative output stage. The output signal from the positive output stage and the output signal from the negative output stage have opposite polarities and are connected to the comparator's negative and positive input terminals respectively. In another embodiment of the present invention, the audio amplifier contains two comparators, a positive output stage, and a negative output stage. The output signal from the positive output stage and the output signal from the negative output stage also have opposite polarities; and the output signal from the positive output stage is connected to the negative input terminal of the first comparator and the positive input terminal of the second comparator; while the output signal from the negative output stage is connected to the positive input terminal of the first comparator and the negative input terminal of the second comparator. Additional feedback loops are introduced to ensure the continuity of comparators' switching cycles regardless of the mismatch between comparators' hysteresis. The present invention helps Class D audio amplifier to achieve superior transient responses, and in turn provide good sound quality and low THD. The resulting variable switching frequencies also help to alleviate the EMI problems.

The description of the invention and its applications as set forth herein is illustrative and is not intended to limit the scope of the invention. Variations and modifications of the embodiments disclosed herein are possible, and practical alternatives to and equivalents of the various elements of the embodiments are known to those of ordinary skill in the art. Other variations and modifications of the embodiments disclosed herein may be made without departing from the scope and spirit of the invention.

We claim:

1. A method for controlling an audio amplifier comprising:
   providing an input signal to a control stage of said audio amplifier;
   providing an output signal from said control stage to a positive output stage comprising a first switch and deriving a first voltage signal that is a first switched signal;
   providing a second output signal from said control stage to a negative output stage comprising a second switch and deriving a second voltage signal that is a second switched signal; and
   applying said first and second voltage signals to two inputs of a load; wherein said first and second voltage signals have pulsating voltage waveforms with opposite polarities and substantially equivalent amplitudes that are fed back to said control stage through a first feedback loop and a second feedback loop respectively, and the difference between said first and second voltages can be as high as the supply voltage of said audio amplifier;
   wherein said control stage contains a first comparator and two drivers, further wherein said first comparator's negative input terminal is connected with the positive part of said input signal and also connected with said first voltage signal through said first feedback loop, while said first comparator's positive input terminal is connected with the negative part of said input signal and also connected with said second voltage signal through said second feedback loop.

2. The method in claim 1, wherein said control stage contains a second comparator; wherein said second comparator's positive input terminal is connected with said first comparator's negative input terminal, and said second comparator's negative input terminal is connected with said first comparator's positive input terminal.

3. The method in claim 2, wherein said first voltage signal is coupled to said first comparator's positive input terminal and said second comparator's negative input terminal through a first impedance, and said second voltage signal is coupled to said first comparator's negative input terminal and said second comparator's positive input terminal through a second impedance; wherein said first and second impedances ensure the continuity of said first and second comparators' switching cycles regardless of the mismatch between said first and second comparators' hystereses.

4. A method for controlling an audio amplifier comprising:
   providing an input signal to a control stage of said audio amplifier;
   providing an output signal from said control stage to a positive output stage comprising a first switch circuit and deriving a first voltage signal that is a first switched signal;
   providing a second output signal from said control stage to a negative output stage comprising a second switch circuit and deriving a second voltage signal that is a second switched signal;
   filtering said first and second voltage signals and deriving a third voltage signal and a fourth voltage signal respectively; and
   applying said third voltage signal and said fourth voltage signal to two inputs of a load; wherein said first and second voltage signals have pulsating voltage waveforms with opposite polarities and substantially equivalent amplitudes that are fed back to said control stage through a first feedback loop and a second feedback loop respectively, and the difference between said first and second voltages can be as high as the supply voltage of said audio amplifier;
   wherein said control stage contains a first comparator and two drivers, further wherein said first comparator's negative input terminal is connected with the positive part of said input signal and also connected with said first voltage signal through said first feedback loop, while said first comparator's positive input terminal is connected with the negative part of said input signal and also connected with said second voltage signal through said second feedback loop.

5. The method in claim 4, wherein said third voltage signal is connected with a negative input terminal of said first comparator through a third feedback loop, and said fourth voltage is connected with a positive input terminal of said first comparator through a fourth feedback loop.

6. The method in claim 5, wherein said third and fourth feedback loops contain capacitors or capacitors and resistors in series.

7. The method in claim 4, wherein said control stage contains a second comparator; wherein said second comparator's positive input terminal is connected with said first comparator's negative input terminal, and said second comparator's negative input terminal is connected with said first comparator's positive input terminal.

8. The method of claim 7, wherein said first voltage signal is coupled to said first comparator's positive input terminal and said second comparator's negative input terminal through a first impedance, and said second voltage signal is coupled to said first comparator's negative input terminal and said second comparator's positive input terminal through a second impedance; wherein said first and second impedances ensure the continuity of said first and second comparators' switching cycles regardless of the mismatch between said first and second comparators' hystereses.

9. The method in claim 7, wherein said third voltage signal is connected with said first comparator's negative input terminal and said second comparator's positive input terminal through a third feedback loop, and said fourth voltage signal is connected with said first comparator's positive input terminal and said second comparator's negative input terminal through a fourth feedback loop.

10. The method in claim 9, wherein said third and fourth feedback loops contain capacitors or capacitors and resistors in series.

11. A circuit for amplifying an audio input signal comprising:
a control stage to receive said audio input signal;
a positive output stage further comprising a first switch circuit to receive an output signal from said control stage and derive a first voltage signal that is a first switched signal;
a negative output stage further comprising a second switch circuit to receive a second output signal from said control stage and derive a second voltage signal that is a second switched signal; and
a load with its two inputs connected to said first voltage signal and said second voltage signal respectively; wherein said first and second voltage signals have pulsating voltage waveforms with opposite polarities and substantially equivalent amplitudes that are fed back to said control stage through a first feedback loop and a second feedback loop, and the difference between said first and second voltages can be as high as the supply voltage of said audio amplifier;
wherein said control stage contains a first comparator and two drivers, further wherein said first comparator's negative input terminal is connected with the positive part of said audio input signal and also connected with said first voltage signal through said first feedback loop, while said first comparator's positive input terminal is connected with the negative part of said audio input signal and also connected with said second voltage signal through said second feedback loop.

12. The circuit in claim 11, wherein said control stage contains a second comparator; wherein said second comparator's positive input terminal is connected with said first comparator's negative input terminal, and said second comparator's negative input terminal is connected with said first comparator's positive input terminal.

13. The circuit in claim 12, wherein said first voltage signal is coupled to said first comparator's positive input terminal and said second comparator's negative input terminal through a first impedance, and said second voltage signal is coupled to said first comparator's negative input terminal and said second comparator's positive input terminal through a second impedance; wherein said first and second impedances ensure the continuity of said first and second comparators' switching cycles regardless of the mismatch between said first and second comparators' hysteresis.

14. A circuit for amplifying an audio input signal comprising:
a control stage to receive said audio input signal;
a positive output stage further comprising a first switch circuit to receive an output signal from said control stage, and derive a first voltage signal that is a first switched circuit;
a negative output stage further comprising a second switch circuit to receive a second output signal from said control stage, and derive a second voltage signal that is a second switched circuit;
filter means to filter said first and second voltage signals and derive a third voltage signal and a fourth voltage signal respectively; and
a load with its two inputs connected with said third and fourth voltage signals, respectively; wherein said first and second voltage signals have pulsating voltage waveforms with opposite polarities and substantially equivalent amplitudes that are fed back to said control stage through a first feedback loop and a second feedback loop respectively, and the difference between said first and second voltages can be as high as the supply voltage of said audio amplifier;
wherein said control stage contains a first comparator and two drivers, further wherein said first comparator's negative input terminal is connected with the positive part of said audio input signal and also connected with said first voltage signal through said first feedback loop, while said first comparator's positive input terminal is connected with the negative part of said audio input signal and also connected with said second voltage signal through said second feedback loop.

15. The circuit in claim 14, wherein said third voltage signal is connected to a negative input terminal of said first comparator through a third feedback loop, and said fourth voltage signal is connected to a positive input terminal of said first comparator through a fourth feedback loop.

16. The circuit in claim 15, wherein said third and fourth feedback loops contain capacitors or capacitors and resistors in series.

17. The circuit in claim 14, wherein said control stage contains a second comparator; wherein said second comparator's positive input terminal is connected with said first comparator's negative input terminal, and said second comparator's negative input terminal is connected with said first comparator's positive input terminal.

18. The circuit of claim 17, wherein said first voltage signal is coupled to said first comparator's positive input terminal and said second comparator's negative input terminal through a first impedance, and said second voltage signal is coupled to said first comparator's negative input terminal and said second comparator's positive input terminal through a second impedance; wherein said first and second impedances ensure the continuity of said first and second comparators' switching cycles regardless of the mismatch between said first and second comparators' hysteresis.

19. The circuit in claim 17, wherein said third voltage signal is connected with said first comparator's negative input terminal and said second comparator's positive input terminal through a third feedback loop, and said fourth voltage signal is connected with said first comparator's positive input terminal and said second comparator's negative input terminal through a fourth feedback loop.

20. The circuit in claim 19, wherein said third and fourth feedback loops contain capacitors or capacitors and resistors in series.

* * * * *